United States Patent

McGeehan et al.

[11] Patent Number: 5,950,119
[45] Date of Patent: Sep. 7, 1999

[54] IMAGE-REJECT MIXERS

[75] Inventors: Joseph Peter McGeehan, Wiltshire; Mark Anthony Beach, Bristol; Andrew Robert Nix, Bristol; Peter Blakeborough Kenington, Bristol, all of United Kingdom

[73] Assignee: University of Bristol, Bristol, United Kingdom

[21] Appl. No.: 08/860,283
[22] PCT Filed: Dec. 21, 1995
[86] PCT No.: PCT/GB95/02995
   § 371 Date: Sep. 24, 1997
   § 102(e) Date: Sep. 24, 1997
[87] PCT Pub. No.: WO96/19863
   PCT Pub. Date: Jun. 27, 1996

[30] Foreign Application Priority Data

Dec. 21, 1994 [GB] United Kingdom .................. 9425842

[51] Int. Cl.$^6$ .................................................. H04B 1/10
[52] U.S. Cl. ......................................... 455/302; 455/304
[58] Field of Search .................................. 455/296, 295, 455/302, 303, 305, 304, 306, 310, 312, 315, 318, 313; 329/318–321, 327, 336, 304

[56] References Cited

U.S. PATENT DOCUMENTS

| 4,814,715 | 3/1989 | Kasperkovitz . |
| 5,033,110 | 7/1991 | Harman .................................... 455/302 |
| 5,369,794 | 11/1994 | Martineau ............................... 455/310 |
| 5,404,589 | 4/1995 | Bijker et al. ............................ 455/304 |
| 5,568,158 | 10/1996 | Gould ..................................... 455/304 |

FOREIGN PATENT DOCUMENTS

| 0 305 604 | 3/1989 | European Pat. Off. . |
| 0 343 273 | 11/1989 | European Pat. Off. . |
| 0 347 761 | 12/1989 | European Pat. Off. . |
| 1-190015 | 7/1989 | Japan . |
| 91/18445 | 11/1991 | WIPO . |
| 94/29948 | 12/1994 | WIPO . |

*Primary Examiner*—Thanh Cong Le
*Attorney, Agent, or Firm*—Townsend and Townsend and Crew LLP

[57] ABSTRACT

An image-reject mixer includes a process for adding a signal to a RF input signal. Any imbalance in the mixer circuitry, which would lead to imperfect image suppression, is corrected by detecting any resulting local oscillator component in the mixer output signal, and adjusting the balance to minimize the size of the local oscillator component.

21 Claims, 7 Drawing Sheets

IMAGE-REJECT MIXERS

BACKGROUND OF THE INVENTION

This invention relates to an image-reject mixer, and in particular to an image-reject mixer which can be used in a wideband receiver.

Any receiver circuit must be designed such that it is able to reject signals in the image band. Typically, this involves using a filter, or tuned RF amplifier in the front end circuitry. In order to allow the receiver to receive signals over a wide range of frequencies, for example over the whole range from 100 MHz to 2 GHz, and to allow the image signal to be sufficiently well separated from the wanted signal, a very high first IF frequency might be chosen. However, this has the disadvantage that it is then difficult or impossible to obtain low-cost high-performance devices for use as the first local oscillator, which would have to operate at very high frequencies, or as the second local oscillator, which again would be operating at a very high frequency and requiring good stability. This arrangement also requires a high dynamic range in the front end, first mixer, first IF amplifier and second mixer.

As a result of these difficulties, it has been proposed to use image-reject mixing to suppress any signals present at the image frequency, without requiring a tuned RF amplifier.

A known image-reject mixer comprises:

first and second mixers;

means for supplying first and second local oscillator signals to the first and second mixers;

means for deriving first and second RF signals from an RF input signal;

means for supplying the first and second RF signals to the first and second mixers, either the first and second local oscillator signals or the first and second RF signals being in quadrature with each other; and a quadrature combiner, connected to receive output signals from the first and second mixers, and to supply a mixer output signal.

A known image-reject mixer of this type is shown in FIG. 1. The image-reject mixer 2 includes first and second mixer circuits 4, 6. The mixers 4, 6 are driven by respective local oscillator signals which differ in phase by 90°. Thus, a local oscillator signal is supplied to a splitter 8, which feeds a first local oscillator signal to the first mixer 4, and a second local oscillator signal, in quadrature with the first, to the second mixer 6. The RF input signal, including the wanted signal together with an image signal, is supplied to a second splitter 10, which feeds the first and second mixers 4, 6. The in-phase splitter 10 may easily be realised for broadband operation by either transformer or resistive splitting techniques; the former is preferable, because the latter has the disadvantage of an additional 3 dB degradation in the mixer noise figure. The output signals from the first and second mixers 4, 6 are supplied to a quadrature combiner 12, that is a device which adds one input to another, with a 90° phase shift in one of the inputs. The effect of this is that the image signal is cancelled in the IF output, and appears in a second output which can be resistively terminated. (If desired, the image signal can be supplied as the output).

The quadrature combiner 12 operates at the IF frequency, and therefore only needs to be a narrow band component, which can use transformer, microstrip, Wireline (Trademark) or lumped-element techniques.

The mixers 4, 6 need to have a good dynamic range, such as can be achieved with high-level diode ring mixers, but may not be achievable with existing IC mixers.

It should be noted that the local oscillator signal could be supplied to the splitter 10, with the RF input signal being supplied in quadrature to the mixers 4, 6 through the splitter 8. However, the illustrated circuit has the advantage that it is simpler to design the required broadband 90° splitter for a constant-level high strength signal such as the local oscillator signal. For example, as is well known, the splitter could be realised by the use of a higher LO frequency divided down by ECL dividers.

Using such a prior art image-reject mixer, it is possible to achieve an image rejection in the region of 20 dB. As such, prior art image-reject mixers are not suitable for use as the only image rejection mechanism in a general purpose receiver, in which image rejection of at least 60 dB may be required.

SUMMARY OF THE INVENTION

The present invention therefore seeks to provide an improved image-reject mixer.

According to a first aspect of the present invention, there is provided an image-reject mixer, comprising:

first and second mixers;

means for supplying first and second local oscillator signals to the first and second mixers;

means for deriving first and second RF signals from an RF input signal;

means for supplying the first and second RF signals to the first and second mixers, either the first and second local oscillator signals or the first and second RF input signals being in quadrature with each other; and a quadrature combiner, connected to receive output signals from the first and second mixers, and to supply a mixer output signal;

characterised in that the mixer further comprises:

means for adding an additional input signal to the first and second RF signals;

means for detecting a local oscillator signal component in the mixer output signal; and means for adjusting the signals supplied to the quadrature combiner to minimise the size of the local oscillator signal component in the mixer output signal.

This has the advantage that accurate gain and phase matching of the paths through the first and second mixers can be used to achieve a high degree of cancellation of the unwanted image signal.

Preferably, the means for adjusting the signals supplied to the quadrature combiner comprises adjustable gain and phase elements.

This allows the gain and phase matching to be controlled as required.

Preferably, the image-reject mixer further comprises:

adjustable gain and phase elements connected to receive the output signal from one of the first and second mixers; and means for controlling the adjustable gain and phase elements on the basis of the detected local oscillator signal component in order to minimise the size of that component.

Minimising the size of the local oscillator component in the mixer output signal ensures that the balance of the image-reject mixer is as accurate as possible, and hence that the degree of image cancellation is maximised.

Preferably, the means for adjusting the balance of the circuit further comprises means for mixing the mixer output signal with a further local oscillator signal at a frequency spaced from the frequency of the input first and second local oscillator signals such that any local oscillator signal component in the mixer output signal produces an intermediate frequency error signal.

This has the advantage that DC signals are not supplied to the detection circuitry.

Preferably, the frequency of the further local oscillator signal is spaced from the frequency of the input first and second local oscillator signals such that the intermediate frequency error signal is at an audio frequency.

This has the advantage that the error signal can be processed in a digital signal processor.

Preferably, the additional input signal is a RF signal separated from the image signal by an audio frequency.

According to a second aspect of the present invention, there is provided a radio- frequency receiver comprising an image-reject mixer in accordance with the first aspect of the invention, the image-reject mixer producing a first IF mixer output signal;

a second IF mixer for generating a second IF mixer output signal from the first IF mixer output signal;

a first main local oscillator for generating the first and second local oscillator signals for supply to the image-reject mixer;

a second main local oscillator for generating a local oscillator signal for supply to the second IF mixer;

means for mixing signals from the first and second main local oscillators to form the additional input signal at a frequency close to the image frequency.

BRIEF DESCRIPTION OF THE DRAWINGS

For a better understanding of the present invention, and to show how it may be brought into effect, reference will now be made, by way of example, to the accompanying drawings in which.

DESCRIPTION OF THE PREFERRED EMBODIMENT

Figure 1:
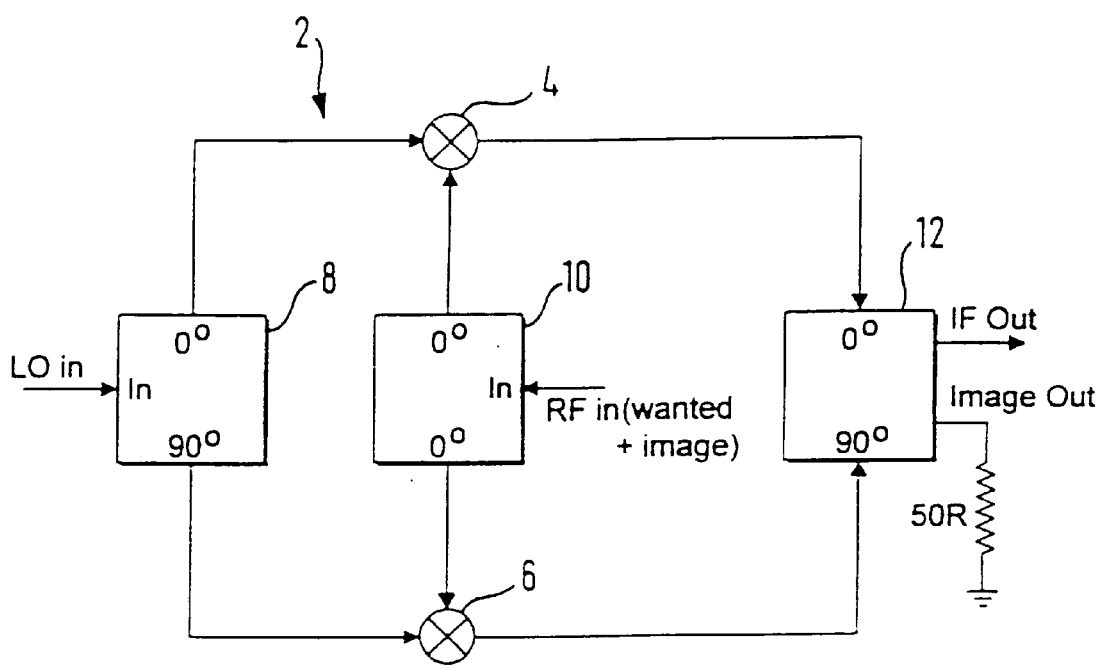
FIG. 1 shows a conventional image-reject mixer.
Figure 2:
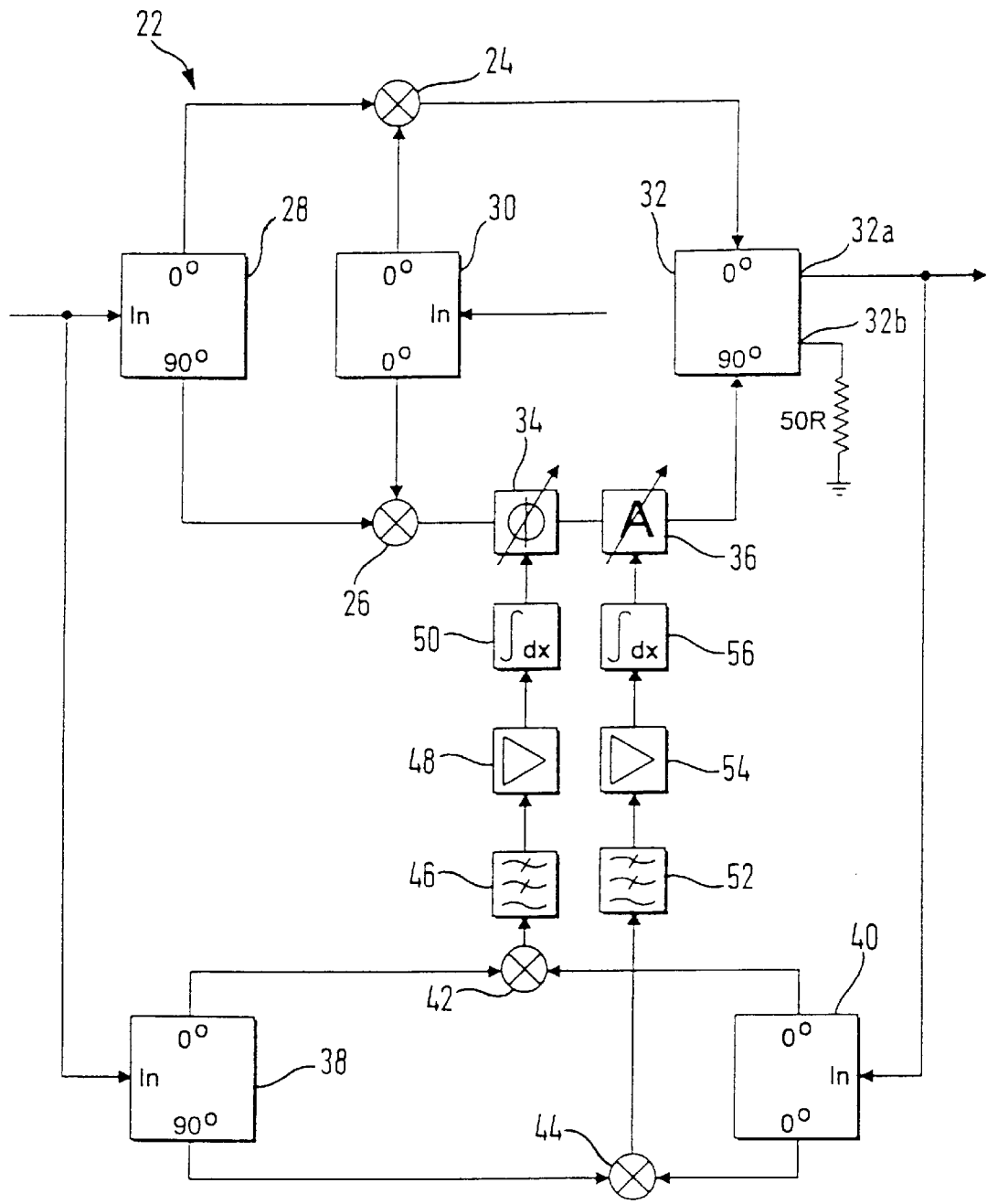
FIG. 2 shows a first image-reject mixer in accordance with the invention.

FIG. 2 shows an image-reject mixer 22 comprising first and second mixers 24, 26. A main local oscillator signal is supplied to a 90° splitter 28, which supplies quadrature local oscillator signals to the mixers 24, 26. Of course, separate phase-locked local oscillators may be used as an alternative. The radio frequency input signal, including the wanted signal together with an image signal, is supplied to a splitter 30, and then to the mixers 24, 26. As in the conventional device shown in FIG. 1, the outputs from the mixers 24, 26 are supplied to a cuadrature combiner 32, which gives an intermediate frequency output signal at one output terminal 32a, and allows the image signal to be suppressed at another output terminal 32b.

The mixer shown in FIG. 2 differs from that shown in FIG. 1 in that a small DC voltage is added to the RF input signal which is supplied to the splitter 30. As an alternative, a small DC voltage may be added to the two signals output from the splitter 30. This may be necessary where the splitter is transformer-based or capacitively coupled, thereby restricting its response at DC. This DC voltage acts through the mixers 24, 26 on the two quadrature components of the local oscillator signal, and the resulting components are combined in the quadrature combiner 32. In the ideal case, where the upper and lower paths through the mixers 24, 26 respectively are perfectly matched, the two local oscillator components resulting from the action of the DC voltage are perfectly cancelled in the quadrature combiner 32. Of course, it is this perfect matching which is also required to allow maximum cancellation of the image signal which is present in the RF input signal. Thus, adding a small DC component to the RF input, causing a local oscillator component to appear in the output, allows the circuit to be controlled, in order to optimise the matching of the circuit and minimise the LO component, and hence maximise cancellation of the image signal.

As shown in FIG. 2, the matching is adjusted by means of an automatic control mechanism, which includes a phase shifter 34 and variable gain element 36 in the output path of the mixer 26. In order to control the circuit to improve the balance, the residual local oscillator signal in the output is detected in I and Q components. It should be noted, however, that the control functions of the circuit could be implemented equally well in amplitude and phase.

For detection of the residual local oscillator component in the output signal, a sample of the local oscillator input signal is fed to a 90° splitter 38, while a sample of the output signal is supplied to a splitter 40. These samples may be taken by any splitting process, for example using resistive or hybrid (transformer-based) splitters, or using directional couplers. One output from each of the splitters 38, 40 is supplied to a third mixer 42, while the second outputs from the splitters 38, 40 are supplied to a fourth mixer 44. Any local oscillator component in the output signal will then result in DC error signals in the outputs of the mixers 42, 44. The output of the mixer 42 is passed to a low-pass filter 46, amplifier 48 and integrator 50, and the output of the integrator 50 is used to control the variable phase shifter 34, in order to adjust this such that the DC output from the mixer 42, and hence the local oscillator component in the output signal is minimised. Similarly, the output from the mixer 44 is passed to a low-pass filter 52, amplifier 54, and integrator 56, with the integrated output signal being used to control the variable gain element 36, again in order to minimise the DC output from the mixer 44, and hence the local oscillator component in the system output signal.

In some circumstances, the low-pass filters 46, 52 and/or the amplifiers 48, 54 may be eliminated, as the integrators 50, 56 may be designed to achieve the same functionality.

This automatic control mechanism therefore controls the gain and phase balance within the image-reject mixer, in order to achieve and maintain a high degree of image rejection.

It will be appreciated that the variable phase control and variable gain elements 34, 36 can appear in a number of locations within the basic circuit, either after the mixer 26 as shown in FIG. 2 or before the mixer, and they can of course appear equally well in the upper path either before or after the mixer 24. The gain and phase control elements can appear in different paths.

Figure 3:
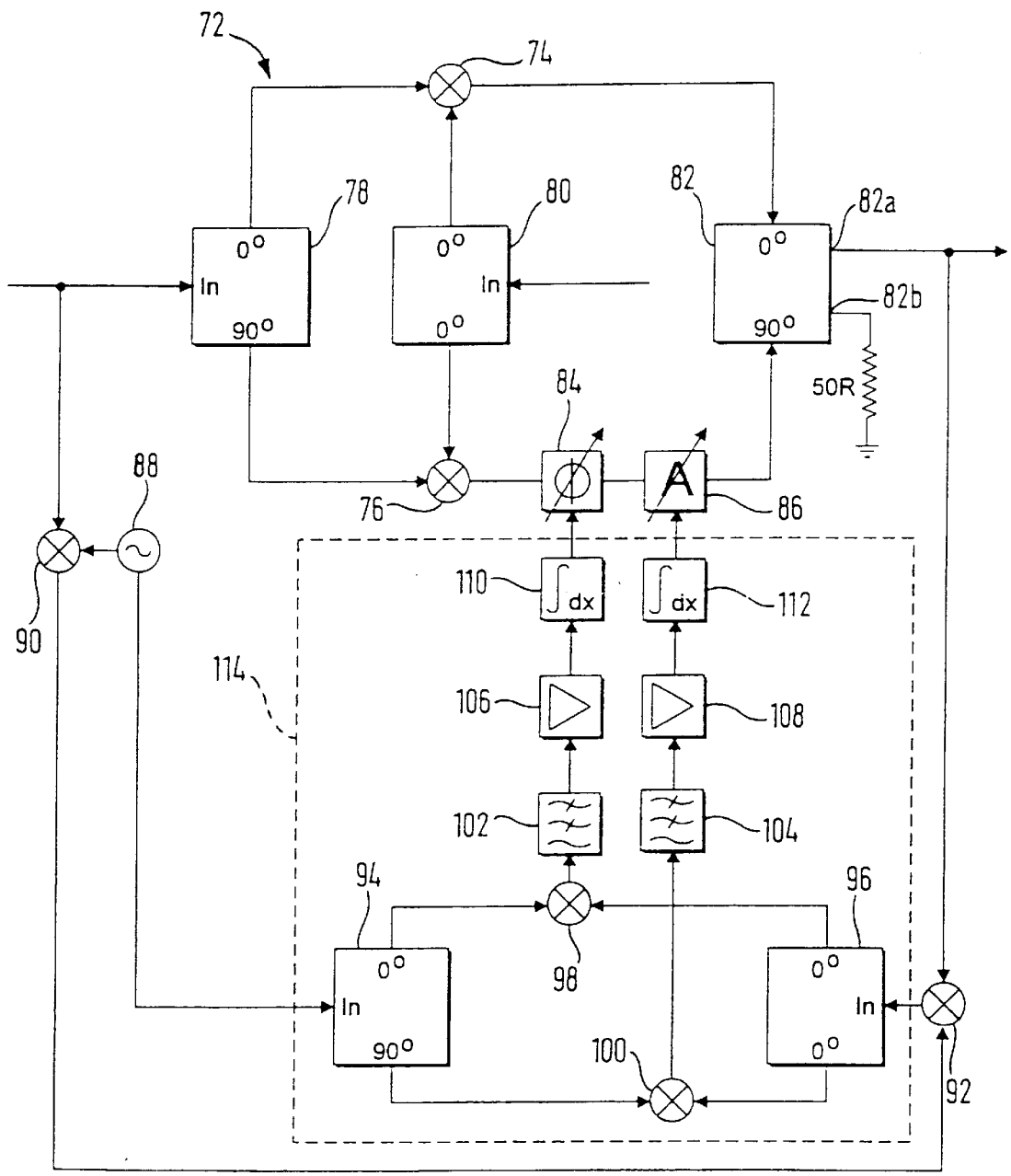
FIG. 3 shows a second image-reject mixer in accordance with the invention.

FIG. 3 shows an image-reject mixer 72, which is similar in many ways to the image-reject mixer 22 shown in FIG. 2. The image-reject mixer comprises first and second mixers 74, 76. A main local oscillator signal is supplied to a 90° splitter 78, which supplies quadrature local oscillator signals to the mixers 74, 76. The radio frequency input signal, including the wanted signal and an image signal, is supplied to a splitter 80, and then to the mixers 74, 76. As in the device shown in FIG. 2, the outputs from the mixers 74, 76 are supplied to a quadrature combiner 82, which gives an intermediate frequency output signal at an output 82a, and allows the image signal to be suppressed at another output 82b.

Also as in the mixer shown in FIG. 2, the matching of the paths through the mixers 74, 76 is adjusted by means of an automatic control mechanism, which includes a phase shifter 84 and variable gain element 86 in the output path of the mixer 76. Again, the local oscillator component in the output signal of the mixer is detected, and the phase shifter 84 and variable gain element 86 are controlled in order to minimise that LO component, and hence maximise cancellation of the image signal.

In this circuit, a signal generator 88 is provided to generate an audio frequency signal. A pair of phase-locked audio frequency signal generators may be used to replace the signal generator 88 and splitter 94. The audio frequency signal from the signal generator 88 is supplied to a mixer 90, to which the main local oscillator signal is also supplied. The output of the mixer 90 is thus a double-side band, suppressed-carrier modulated signal. In effect, this acts as a second local oscillator signal, closely spaced from the main local oscillator signal. This second local oscillator signal from the mixer 90 is supplied to a further mixer 92, to which the output signal of the device is also supplied. This mixer 92 then downconverts the residual main local oscillator component in the output signal to an audio frequency error signal. This audio frequency signal can then be compared with the audio frequency signal generated by the signal generator 88, and the variable phase shifter 84 and gain controller 86 can be adjusted in order to minimise the size of the local oscillator component in the output signal, by minimising the size of the audio frequency error signal.

It will be noted that FIG. 3 shows splitters 94, 96, mixers 98, 100, filters 102, 104, amplifiers 106, 108 and integrators 110, 112, corresponding to the similar components in the embodiment shown in FIG. 2. However, the advantage of using an offset local oscillator to create an audio frequency error signal is that, with the addition of suitable A/D and D/A converters, this error signal can be processed in a DSP 114, meaning that the necessary processing can be carried out in software, without requiring discrete components to be used. The DSP 114 may be used to generate the audio frequency signal, replacing the oscillator 88, with a suitable output to the mixer 90.

Figure 4:
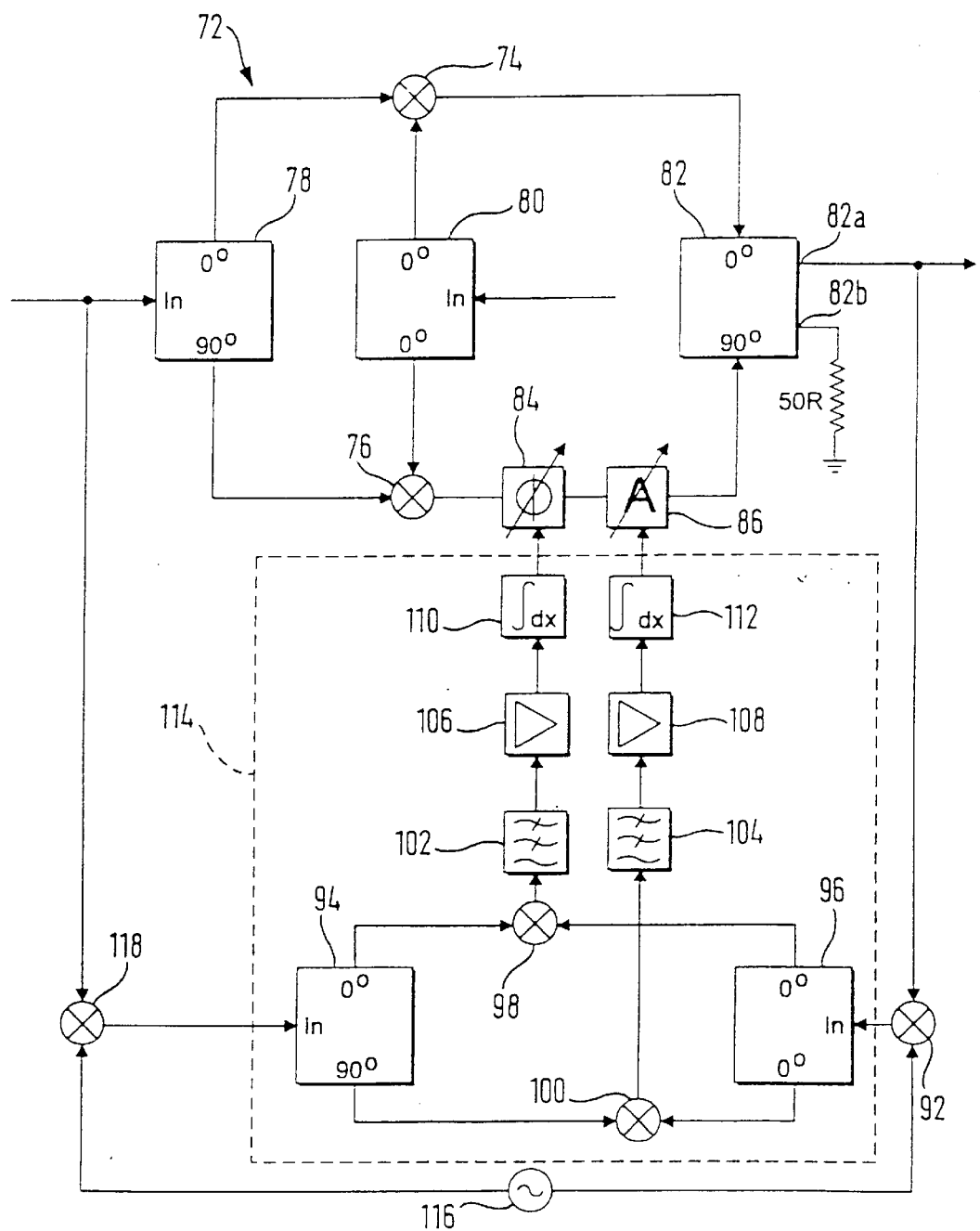
FIG. 4 shows a third image-reject mixer in accordance with the invention.

FIG. 4 shows a mixer operating on the same principle as that shown in FIG. 3. Components of the device shown in FIG. 4 having the same reference numerals as components of the device shown in FIG. 3 have the same functions as those components, and their description will not be repeated. In the mixer shown in FIG. 4, the tracking local oscillating signal is generated by means of a further RF local oscillator 116. The signal from the local oscillator 116 is supplied to the mixer 92, which therefore gives an audio frequency error signal, and to a further mixer 118, which generates an audio frequency reference signal. The local oscillator 116 needs to be locked to the main local oscillator and track it in order to maintain a constant frequency separation. This frequency separation needs to be sufficiently small to allow the difference signals generated by the mixer 92 and by the mixer 118 to have a sufficiently low frequency, for example an audio frequency, for processing by the DSP controller.

The frequency separation of the local oscillator 116 from the main local oscillator need not be constant over the whole range of coverage of the receiver, and it may allow a more coarsely synthesized tracking local oscillator, i.e. an oscillator having larger frequency steps, to be used. For example, if the main local oscillator is synthesized in 5 kHz steps, the tracking local oscillator 116 could be synthesized in 25 kHz steps, thus giving a maximum difference frequency of 25 kHz. Nevertheless, using a tracking local oscillator as shown in FIG. 4 may be a more expensive solution than the arrangement shown in FIG. 3. Nevertheless, these options, allowing processing of the error signal in a DSP, will also overcome the problems of DC offsets in the I/Q detection mixers and subsequent analogue processing in the embodiment shown in FIG. 2.

The embodiments of the invention shown in FIGS. 2, 3 and 4 all involve adding a small DC voltage to the input RF signal which is supplied to the image-reject mixer with the intention that any imbalance in the mixer circuit will then result in a small local oscillator component in the output signal, which can be detected, allowing the balance of the circuit to be controlled in order to minimize this local oscillator component.

Figure 5:
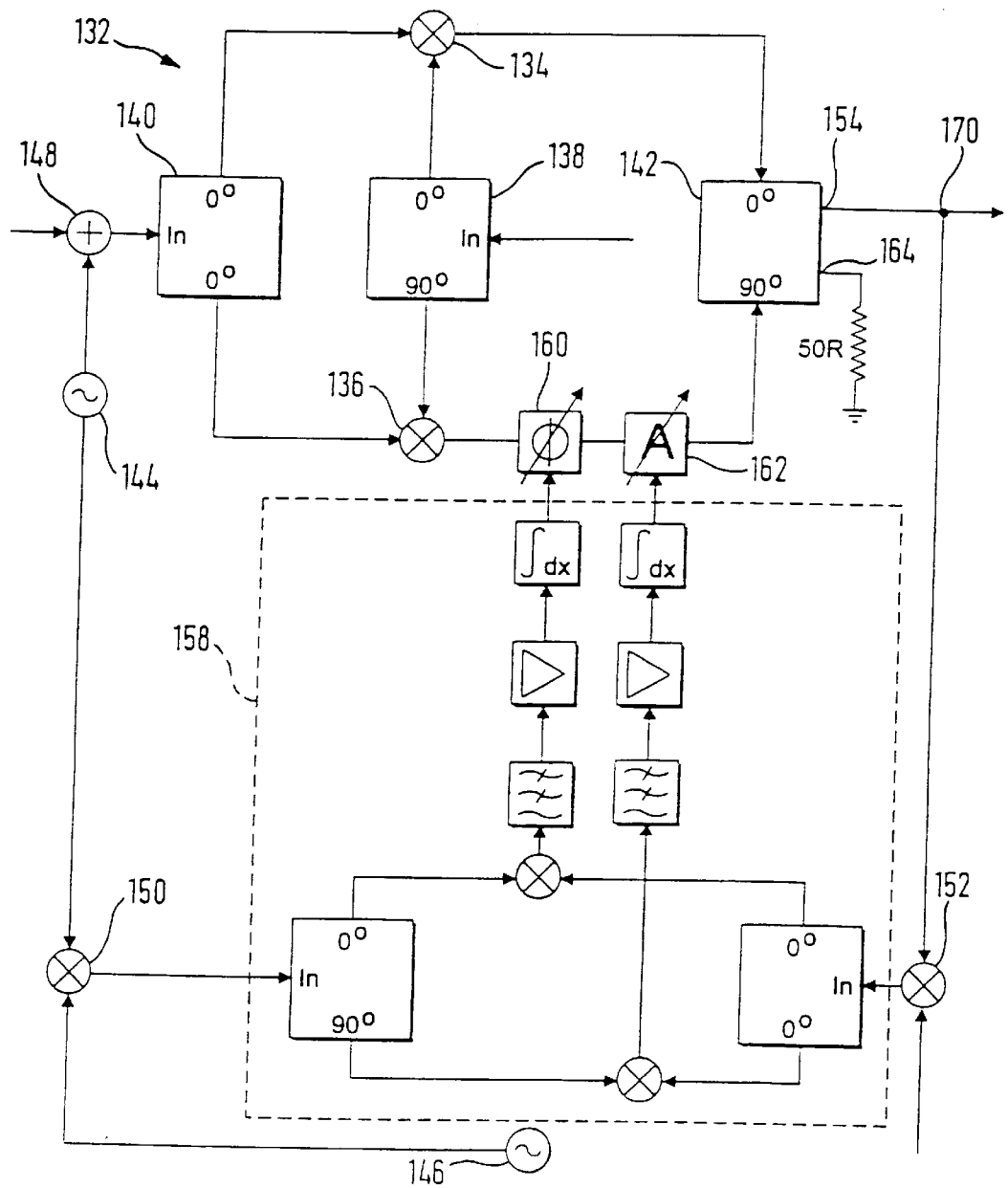
FIG. 5 shows a fourth image-reject mixer in accordance with the invention.

FIG. 5 shows an alternative image-reject mixer, in which, instead of a small DC component, a radio frequency sounding signal is added to the input RF signal.

The image-reject mixer 132 shown in FIG. 5 comprises first and second mixers 134, 136. A main local oscillator signal is supplied to a 90° splitter 138, which supplies quadrature local oscillator signals to the mixers 134, 136. The radio frequency input signal, containing the wanted signal together with an image signal, is supplied to a splitter 140, and then to the mixers 134, 136. The outputs from the mixers 134, 136 are supplied to a quadrature combiner 142, which gives an intermediate frequency output signal at one output 154, and allows the image signal to be suppressed at the other output 164.

The mixer 132 shown in FIG. 5 comprises a first additional RF oscillator 144 for generating a sounding signal, and a second additional RF oscillator 146, for generating a detection signal. The first additional oscillator 144 generates a sounding signal at a frequency close to the image frequency, which is injected into the input RF signal by means of an adder 148. The sounding signal should be injected at a level suitable to provide adequate image rejection control.

The signal from the first additional oscillator 144 is supplied to a mixer 150, while the signal from a second additional oscillator 146, at a frequency separated from that of the signal from the first additional oscillator 144 by an audio frequency suitable for processing by a DSP, for example, 5 kHz, is supplied to the mixer 150.

In this case, the sounding signal, when mixed with the quadrature local oscillator components in the mixers 134, 136 has the effect that any imbalance in the main mixer circuit causes a sounding signal component to appear at the intermediate frequency output 154 of the mixer 132. The reference signal output from the mixer 150 and the error signal output from the mixer 152 are supplied to a DSP 158, which implements in software the functions necessary to control a variable phase shifter 160 and variable gain element 162, in order to minimize the size of the sounding signal component in the output signal, and hence balance the circuit and therefore also maximise image rejection. The function of the DSP 158 is similar to that of the DSP 144 in the mixer described with reference to FIG. 3, and is not described further.

In this embodiment of the invention, with the signal injected by the oscillator 144 at a frequency close to the image frequency, the control circuitry will act to null out this injected signal at the IF output port 154 of the mixer. It may be noted that, if the signal injected by the oscillator 144 is at a frequency close to the wanted transmission frequency, the control circuitry will act to null the injected sounding signal at the image output 64 of the mixer and hence receive the image frequency. Thus the image and wanted frequencies may easily be interchanged. The injected sounding signal could take the form of a CW carrier, a spread-spectrum signal (frequency-hopped or direct sequence), a swept tone or a switched (DTM) signal. The frequency of the signal may be chosen from a relatively wide range, with the wanted transmission and image frequencies being able to appear on either side of the local oscillator frequency, depending upon the implementation of the image-reject mixer. For example, this would be altered if the output 164 of the combiner 142 were taken as the IF output.

As described, with the image frequency higher than the wanted transmission frequency, then the sounding signal could be at any frequency higher than the local oscillator frequency. Placing the injected sounding signal at a frequency close to, but spaced from, the image frequency has several advantages. Firstly, correlation between the image signal and the sounding signal, which may provide erroneous control information, is avoided. Secondly, any component of the injected sounding signal which is not cancelled by the image-reject mixer, and appears at the IF output 154 will be offset from the wanted IF frequency signal, and so will not pass through the IF filter. Thirdly, if the sounding tone is close to the image frequency, there will still be good correlation between the image null point and the null point of the sounding signal. This ensures that there will be a high level of image rejection, despite the frequency difference between the two signals. The sounding signal is probably optimally placed one or two channels away from the image frequency.

FIG. 5 shows a system in which the sounding signal and the detection signal are generated using respective further wide-coverage RF synthesizers 144, 146. However, it will be appreciated that this is a relatively expensive technique. A first alternative configuration for generating the sounding signal is shown in FIG. 6.

Figure 7:
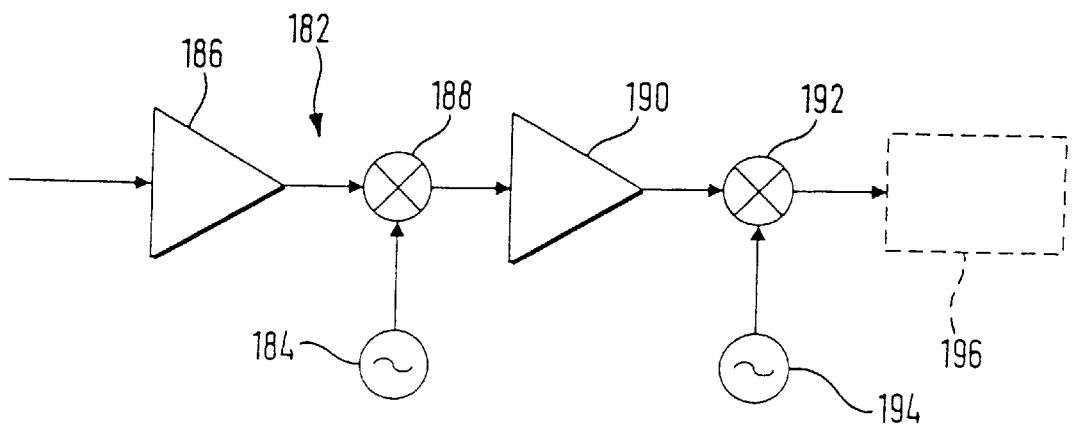
FIG. 7 shows a conventional radio receiver.

The image-reject mixer is, for example, for use in a receiver as shown in FIG. 7. In FIG. 7, there is shown a receiver 182 comprising a wide-coverage synthesizer 184 generating a first main local oscillator signal at, for example, 100 MHz. A front end amplifier 186 receives a RF input signal, for example at 90 MHz, which will therefore have an associated image signal at 110 MHz. The output signal from the mixer 188 is supplied to the first IF amplifier and filter 190, and then to a further mixer 192, to which is also supplied a signal from a second main local oscillator 194, for example at 9.98 MHz. The resulting output signal at 20 kHz is supplied to a DSP 196 for processing, for example filtering, downconverting and demodulating.

The receiver 182 thus includes first and second main local oscillators generating signals at 100 MHz and 9.98 MHz. Mixing the two local oscillator signals will give a tone at 109.98 MHz, which is sufficiently close to the image frequency to be usable as the sounding signal in the configuration shown in FIG. 5. In that configuration, the detector signal, generated by the oscillator 146 in FIG. 5, can then be at 109.975 MHz, and that can be obtained by mixing the first main local oscillator signal at 100 MHz with a signal at 9.975 MHz generated by a fixed-frequency oscillator. However, this configuration would cause the difficulty that mixing the two main local oscillator signals generated by the oscillators 184 and 194 would also give a signal at 90.02 MHz, which would also be injected into the RF input signal, and this would interfere with the wanted sounding signal in the IF section of the image-reject mixer. Although in a fixed-frequency or narrow coverage design this signal could be filtered out, this would not be possible if the mixer were intended to provide wide coverage.

Figure 6:
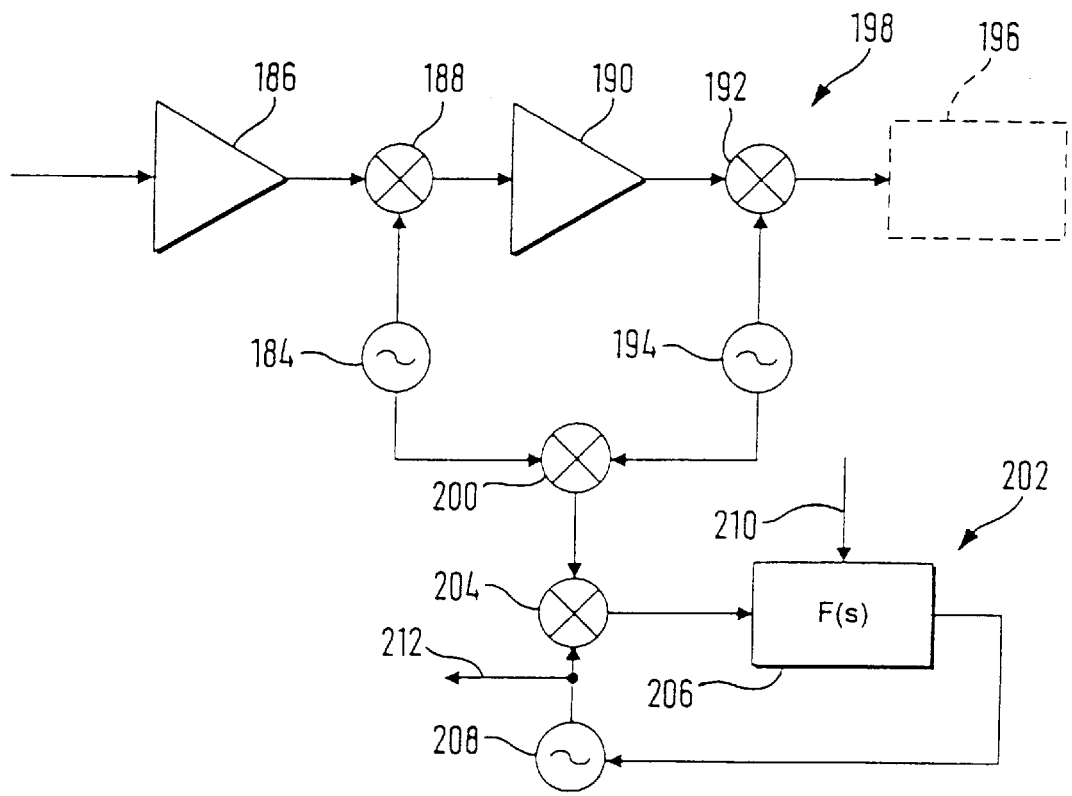
FIG. 6 shows a radio receiver in accordance with the second aspect of the invention.

FIG. 6 shows a receiver in which this problem is overcome, and in which the sounding signal referred to in connection with FIG. 5 is generated using the existing local oscillator signals. In FIG. 6, the receiver 198 includes a first main local oscillator 184, front-end amplifier 186, image-reject mixer 188 as described in more detail in connection with FIG. 5, first IF amplifier and filter 190, mixer 192, second main local oscillator 194, and DSP 196. The signals from the local oscillators 184, 194 are mixed in a mixer 200; as previously discussed, this produces output signals at 109.98 MHz and at 90.02 MHz. These outputs are then passed to a phase-locked loop 202, comprising a phase detector 204, loon filter 206 and wide coverage voltage-controlled oscillator 208. The VCO must cover the full range of the receiver, and must be restricted to pull-in from the upper end of the frequency range. As shown in FIG. 6, this is achieved by supplying a sweep signal, starting at the top of the frequency coverage band, to the input 210 of the loop filter 206. The VCO 208 then always encounters the higher of the two input frequency signals (i.e. the signal at 109.98 MHz, close to the image signal) first, and should lock onto that. As a result, the output signal of the VCO at 212 will be a signal tone at the required frequency.

The resulting output signal at 212 can then be supplied to the image-reject mixer 188 as the sounding signal, replacing the signal from the oscillator 144 in FIG. 5.

As discussed above, the detector signal (shown in FIG. 5 being generated by a wide-coverage synthesizer 146) can be obtained by mixing a signal from a fixed-frequency oscillator at 9.975 MHz with the main local oscillator signal, at 100 MHz in this example.

Figure 8:
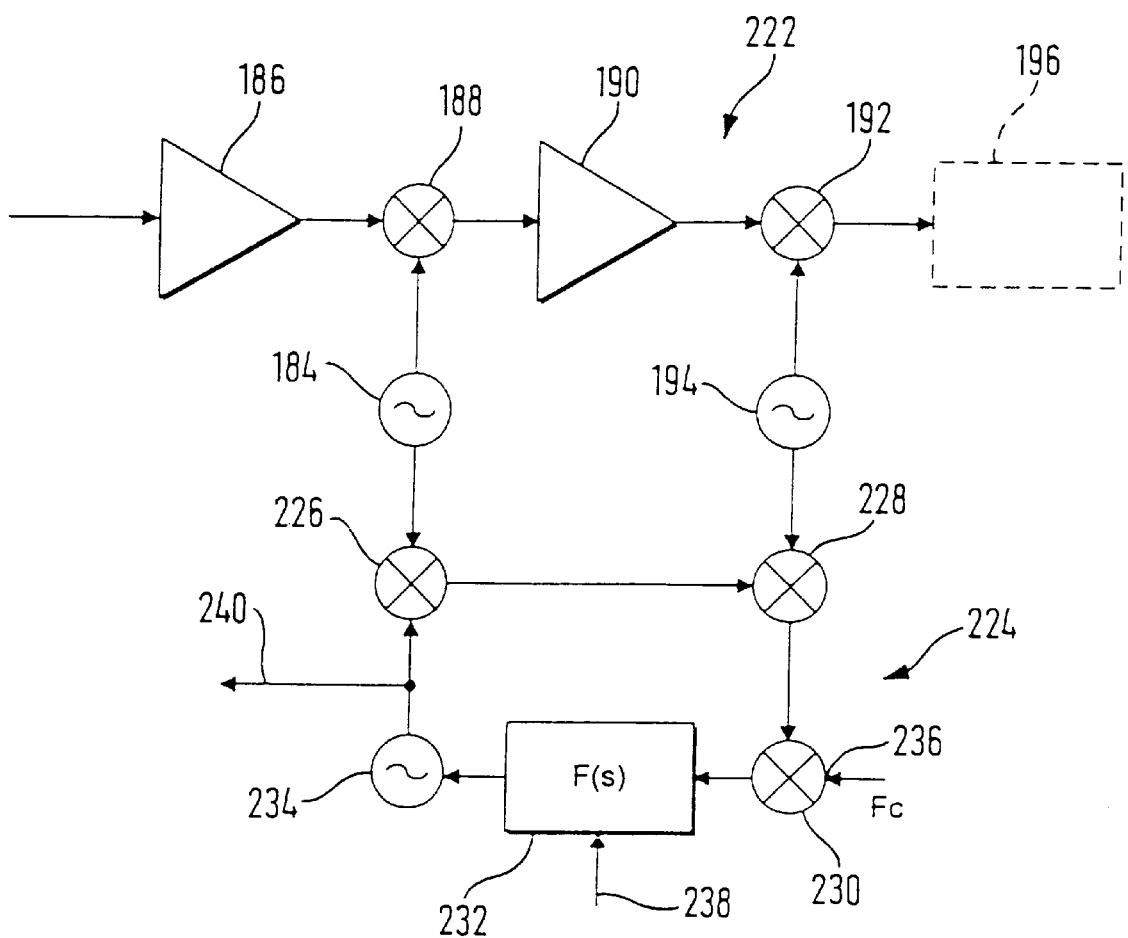
FIG. 8 shows a second radio receiver in accordance with the second aspect of the invention.

FIG. 8 shows a further modified receiver, again derived from the basic structure shown in FIG. 7. Again, the receiver 222 comprises a first main local oscillator 184, front-end amplifier 186, image-reject mixer 188 as described in more detail with reference to FIG. 5, first IF amplifier and filter 190, mixer 192, second main local oscillator 194 and DSP 196. In the receiver 222, a phase-locked loop 224 comprises a phase detector 226, first mixer 228, second mixer 230, loop filter 232, and VCO 234. An audio frequency signal $F_c$, which may be generated in the DSP 196 or otherwise, is supplied to the input 236 of the second mixer 230, while, as described in more detail with reference to FIG. 6, a high-low sweep signal is supplied at the input 238 of the loop filter 232. The result is that the two signals from the local oscillators 184, 194 are mixed with each other, and with the audio frequency signal $F_c$, and so the output signal at 240 will be at a frequency equal to the sum of these three signals. Any convenient frequency $F_c$ may be chosen, although $F_c$ is preferably not equal to the DSP operating frequency, as, in this configuration, this causes the output signal at 240 to appear at the image frequency, which is not desirable. Again, it is the signal derived from the sum of the two local oscillator signals, rather than from the difference of the two local oscillator signals which appears at the output. Mixer 152 and oscillator 146 are thus eliminated, with an oscillator generating the audio frequency $F_c$ being provided internally within the DSP (in software) and providing the input signal to the splitter 170 in FIG. 5. This configuration has the advantage that the audio frequency $F_c$ can be generated internally in a DSP, and can therefore form the offset frequency for the DSP gain/phase element controller shown in FIG. 5. In addition, as the phase detection process now takes place at an audio frequency, the operation of the loop should be more stable.

The invention is described herein in terms of minimising the local oscillator component appearing in the wanted output. However, the same techniques can be used to maximise the amount of image signal at the image signal output 32b, or (with a sounding signal close to the wanted channel) to minimise the sounding signal level in the image output part or maximise it in the wanted output port.

It can therefore be seen that the present invention provides an image-reject mixer, and a receiver comprising such a mixer, which can provide wide coverage with a high dynamic range, and a high degree of cancellation of image signals.

We claim:

1. An image-reject mixer, comprising:
   first and second mixers;
   means for supplying first and second local oscillator signals to the first and second mixers;
   means for deriving first and second RF signals from an RF input signal;
   means for supplying the first and second mixers, either the first and second local oscillator signals or the first and second RF signals being in quadrature with each other;
   a quadrature combiner, connected to receive output signals from the first and second mixers, and to supply a mixer output signal;
   an input for receiving an additional mixer input signal;
   means for adding the additional mixer input signal to the first and second RF signals, the additional mixer input signal causing a residual component to appear in the mixer output signal;
   means for detecting the residual component in the mixer output signal; and
   adjustable gain and phase elements for acting on at least one of the signals supplied to the quadrature combiner to minimise the residual component in the mixer output signal.

2. An image-reject mixer as claimed in claim 1, wherein the means for supplying first and second local oscillator signals to the first and second mixers comprises a RF oscillator and a splitter for generating first and second local oscillator signals.

3. An image-reject mixer as claimed in claim 1 or 2, wherein the means for adjusting the signals supplied to the quadrature combiner comprises adjustable gain and phase elements.

4. An image-reject mixer as claimed in claim 3, wherein the adjustable gain and phase elements are connected to the output of one of the first and second mixers.

5. An image-reject mixer as claimed in claim 1 wherein the means for adjusting the signals supplied to the quadrature combiner comprises means for detecting in-phase and cuadrature components of the local oscillator signal component in the mixer output signal.

6. An image-reject mixer as claimed in claim 5, wherein the means for adjusting the signals supplied to the quadrature combiner further comprises means for mixing the mixer output signal with in-phase and quadrature components of the input local oscillator signal such that any local oscillator signal component in the output signal produces a DC error signal.

7. An image-reject mixer as claimed in claim 1 wherein the means for adjusting the signals supplied to the quadrature combiner comprises means for detecting the amplitude and phase of the local oscillator signal component in the mixer output signal.

8. An image-reject mixer as claimed in claim 5, wherein the means for adjusting the signals supplied to the quadrature combiner further comprises means for mixing the mixer output signal with
   a further local oscillator signal at a frequency spaced from the frequency of the input first and second local oscillator signals such that any local oscillator signal component in the mixer output signal produces an intermediate frequency error signal.

9. An image-reject mixer as claimed in claim 8, wherein the frequency of the further local oscillator signal is spaced from the frequency of the input first and second local oscillator signals such that the intermediate frequency error signal is at an audio frequency.

10. An image-reject mixer as claimed in claim 9, further comprising a digital signal processor for receiving the audio intermediate frequency error signal.

11. An image-reject mixer as claimed in claim 1, further comprising:
    means for detecting a local oscillator signal component in the mixer output signal;
    adjustable gain and phase elements connected to receive the output signal from one of the first and second mixers; and
    means for controlling the adjustable gain and phase elements on the basis of the detected local oscillator signal component in order to minimise the size of that component.

12. An image-reject mixer as claimed in claim 1, wherein the additional input signal is a DC voltage.

13. An image-reject mixer as claimed in claim 1, wherein the additional input signal is a RF signal.

14. An image-reject mixer as claimed in claim 13, wherein the RF signal is at a frequency spaced from the image signal by an audio frequency.

15. An image-reject mixer as claimed in claim 13, comprising means for generating the first and second local oscillator signals and the additional RF signal from the same RF oscillator.

16. A radio frequency receiver, comprising:
    an image-reject mixer as claimed in claim 13, the image-reject mixer producing a first IF mixer output signal;
    a second IF mixer for generating a second IF mixer output signal from the first IF mixer output signal;
    a first main local oscillator for generating the first and second local oscillator signals for supply to the image-reject mixer;
    a second main local oscillator for generating a local oscillator signal for supply to the second IF mixer;
    means for mixing signals from the first and second main local oscillators to form the additional signal at a frequency close to the image frequency.

17. A receiver as claimed in claim 16, further comprising a phase-locked loop to which is supplied the output from the means for mixing signals from the first and second main local oscillators, the phase-locked loop being controlled such that the output thereof is at a frequency close to the image frequency.

18. An image-reject mixer, comprising:

first and second mixers;

means for supplying first and second local oscillator signals to the first and second mixers;

means for deriving first and second RF signals from an RF input signal;

means for supplying the first and second Rf signals to the first and second mixers, either the first and second local oscillator signals or the first and second RF signals being in quadrature with each other;

a quadrature combiner, connected to receive output signals from the first and second mixers, and to supply a mixer output signal;

an input for receiving an additional DC mixer input signal;

means for adding the additional DC mixer input signal to the first and second RF signals, the additional mixer input signal causing a residual local oscillator component to appear in the mixer output signal;

means for detecting the residual local oscillator component in the mixer output signal; and adjustable gain and phase elements for acting on at least one of the signals supplied to the quadrature combiner to minimise the residual local oscillator component in the mixer output signal.

19. An image-reject mixer, comprising:

first and second mixers;

means for supplying first and second local oscillator signals to the first and second mixers;

means for deriving first and second RF signals from an RF input signal;

means for supplying the first and second RF signals to the first and second mixers, either the first and second local oscillator signals or the first and second RF signals being in quadrature with each other;

a quadrature combiner, connected to receive output signals from the first and second mixers, and to supply a mixer output signal;

an input for receiving an additional radio frequency mixer input signal;

means for adding the additional radio frequency mixer input signal to the first and second RF signals, the additional radio frequency mixer input signal causing an audio frequency residual component to appear in the mixer output signal;

means for detecting the audio frequency residual component in the mixer output signal; and adjustable gain and phase elements for acting on at least one of the signals supplied to the quadrature combiner to minimise the audio frequency residual component in the mixer output signal.

20. An image-reject mixer as claimed in claim 19, wherein the adjustable gain and phase elements are in the form of a digital signal processor.

21. A radio frequency receiver comprising:

an image-reject mixer producing a first IF mixer output signal, the image reject mixer comprising:

first and second mixers;

means for supplying first and second local oscillator signals to the first and second mixers;

means for deriving first and second RF signals from an RF input signal;

means for supplying the first and second RF signals to the first and second mixers, either the first and second local oscillator signals or the first and second RF signals being in quadrature with each other; and a quadrature combiner, connected to receive output signals from the first and second mixers, and to supply a mixer output signal;

means for adding an additional input signal to the first and second RF signals, the additional input signal being an RF signal;

means for detecting a local oscillator signal component in the mixer output signal; and means for adjusting the signals supplied to the quadrature combiner to control the size of the local oscillator signal component in the mixer output signal;

a second IF mixer for generating a second IF mixer output signal from the first IF mixer output signal;

a first main local oscillator for generating the first and second local oscillator signals for supply to the image-reject mixer;

a second main local oscillator for generating a local oscillator signal for supply to the second IF mixer;

means for mixing signals from the first and second main local oscillators to form the additional signal at a frequency close to the image frequency; and a phase-locked loop to which is supplied the output from the means for mixing signals from the first and second main local oscillators, the phase-locked loop being controlled such that the output thereof is at a frequency close to the image frequency.

* * * * *